(12) United States Patent
Lakshminarayana et al.

(10) Patent No.: US 7,987,412 B2
(45) Date of Patent: Jul. 26, 2011

(54) REED SOLOMON DECODING OF SIGNALS HAVING VARIABLE INPUT DATA RATES

(75) Inventors: Ganesh Lakshminarayana, Plainsboro, NJ (US); Jayanta Das, Morganville, NJ (US)

(73) Assignee: Alphion Corporation, Princeton Junction, NJ (US)

( * ) Notice: Subject to any disclaimer, the term of this patent is extended or adjusted under 35 U.S.C. 154(b) by 1034 days.

(21) Appl. No.: 11/755,614

(22) Filed: May 30, 2007

(65) Prior Publication Data

US 2007/0300137 A1  Dec. 27, 2007

Related U.S. Application Data

(60) Provisional application No. 60/803,436, filed on May 30, 2006.

(51) Int. Cl.
*H03M 13/00* (2006.01)
(52) U.S. Cl. .......... 714/784; 714/772; 714/776
(58) Field of Classification Search .......... 714/784, 714/773, 753, 775, 776, 758, 774, 789, 701
See application file for complete search history.

(56) References Cited

U.S. PATENT DOCUMENTS

| 4,597,083 | A  | * | 6/1986  | Stenerson      | 714/753 |
| 4,649,541 | A  | * | 3/1987  | Lahmeyer       | 714/784 |
| 6,233,712 | B1 | * | 5/2001  | Rhee et al.    | 714/789 |
| 6,343,305 | B1 | * | 1/2002  | Ko.cedilla. et al. | 708/492 |
| 6,480,976 | B1 | * | 11/2002 | Pan et al.     | 714/701 |
| 6,550,035 | B1 | * | 4/2003  | Okita          | 714/774 |

\* cited by examiner

*Primary Examiner* — Fritz Alphonse
(74) *Attorney, Agent, or Firm* — Sorin Royer Cooper LLC

(57) ABSTRACT

A method and apparatus to achieve a resource optimized, class of Reed Solomon decoders, featuring balanced pipelined stages and parallel algorithmic components. The Reed Solomon decoder has two pipeline stages, with one stage implementing syndrome computation and the second stage implementing error locator polynomial evaluation, error location and error correction. Since the second pipeline stage performs several tasks, these tasks can share resources with each other, resulting in a compact implementation. In addition, we present a technique that can be used to compute the level of parallelism required of two key algorithmic components (syndrome computation, error location) so that the RS decoder can handle inputs of variable rates, with minimal latency and resource consumption. We show that low latency, in itself, is an important consideration for Reed Solomon decoders, and can lead to reduced buffering, resulting in significant hardware savings.

16 Claims, 3 Drawing Sheets

(A)

(B)

REED SOLOMON DECODING OF SIGNALS HAVING VARIABLE INPUT DATA RATES

CROSS-REFERENCE TO RELATED APPLICATIONS

This application claims the benefit of U.S. Provisional Patent Application Ser. No. 60/803,436, filed May 30, 2006, the entirety of the disclosure of which application is incorporated herein by reference.

BACKGROUND OF THE INVENTION

The present invention relates generally to data communication and, more particularly, concerns a method and apparatus for decoding signals of variable data rates that have been previously encoded with a Reed Solomon (RS) code.

Reed Solomon Codes are a ubiquitous class of error correcting codes, employed in various types of communication systems, for example, fiber optic systems and HDTV applications. Due to their wide applicability, RS encoders and decoders are employed in several different scenarios, characterized by differing resource constraints, input data rates, and error correction abilities. Optimizing an RS implementation strongly depends on the usage scenario.

An RS code is characterized by the following parameters, m and t, where m is the length of a single data word and t is the maximum number of errors that can be corrected. The total length of the code block is $2^m-1$, of which 2t words are parity words and $2^m-1-2t$ words are a copy of the original message.

RS decoding proceeds in five distinct steps:

Syndrome computation: In this step, the 2t syndrome words are computed from the received code word, $r_1$, $r_2, \ldots, r_n$ using the following formula:

$$s_i = \sum_{j=1}^{n} r_j \alpha_i^j, \ i \in \{1, 2, 3, \ldots, 2t\} = \sum_{j=1}^{n} r_j X_j^i, \ \text{where } X_j = \alpha^j \quad (1)$$

Error locator polynomial computation: The error locator polynomial, $\Lambda$, has degree t, and its roots are given by a $\alpha^{-j}$ where j corresponds to an error location. $\Lambda(z) = 1 + \sigma_1 z + \sigma_2 z^2 + \ldots + \sigma_t z^t$ Error evaluator polynomial computation: The error evaluator polynomial, $\Omega$, has t-1 roots and is used in a formula to compute the magnitude of the error once the location of an erroneous word is known.

Error location: Once the error locator polynomial is known, each of $2^m-1$ possible error locations is tried out as a potential error location by evaluating the $\Lambda(\alpha^{-j})$, $j \in \{1,2,\ldots,255\}$. A maximum of t error locations are identified.

Error correction: For each of the identified error location, the magnitude of the error is calculated according to the following formula: $e_k = \alpha^{-k} \Omega(\alpha^{-k})/\Lambda'(\alpha^{-k})$, and the $k^{th}$ received word is corrected according to the formula: $r_k = r_k + e_k$

SUMMARY OF THE INVENTION

In accordance with one aspect of the present invention, a class of RS decoder architectures is disclosed that can be used under differing input data rates. A preferred architecture divides the tasks that need to be performed by the RS decoder: Syndrome computation, Error locator polynomial evaluation, Error location, and Error evaluation into an optimal two stage pipeline that balances the execution times of individual pipeline stages, and optimizes resource sharing within the pipeline stage.

In order to cope with changes in input data rate, two key algorithmic components: syndrome computation and error location need to be parallelized. We present a technique to determine the degree of parallelism required of each of these components.

Overall, the division into a two stage pipeline, resource sharing within the pipeline stages, and parallelism of algorithmic components creates a resource efficient, low latency family of RS decoders that can work at different input data rates. The decrease in latency is, in itself an important figure of merit that can result in significantly less buffering, and therefore, itself reduce resource usage.

BRIEF DESCRIPTION OF THE DRAWINGS

The foregoing brief description and further objects, features and advantages of the present invention will be understood more completely from the following detailed description of presently preferred embodiments, with reference being had to the accompanying drawings in which.

DETAILED DESCRIPTION OF THE PREFERRED EMBODIMENTS

Figure 1:
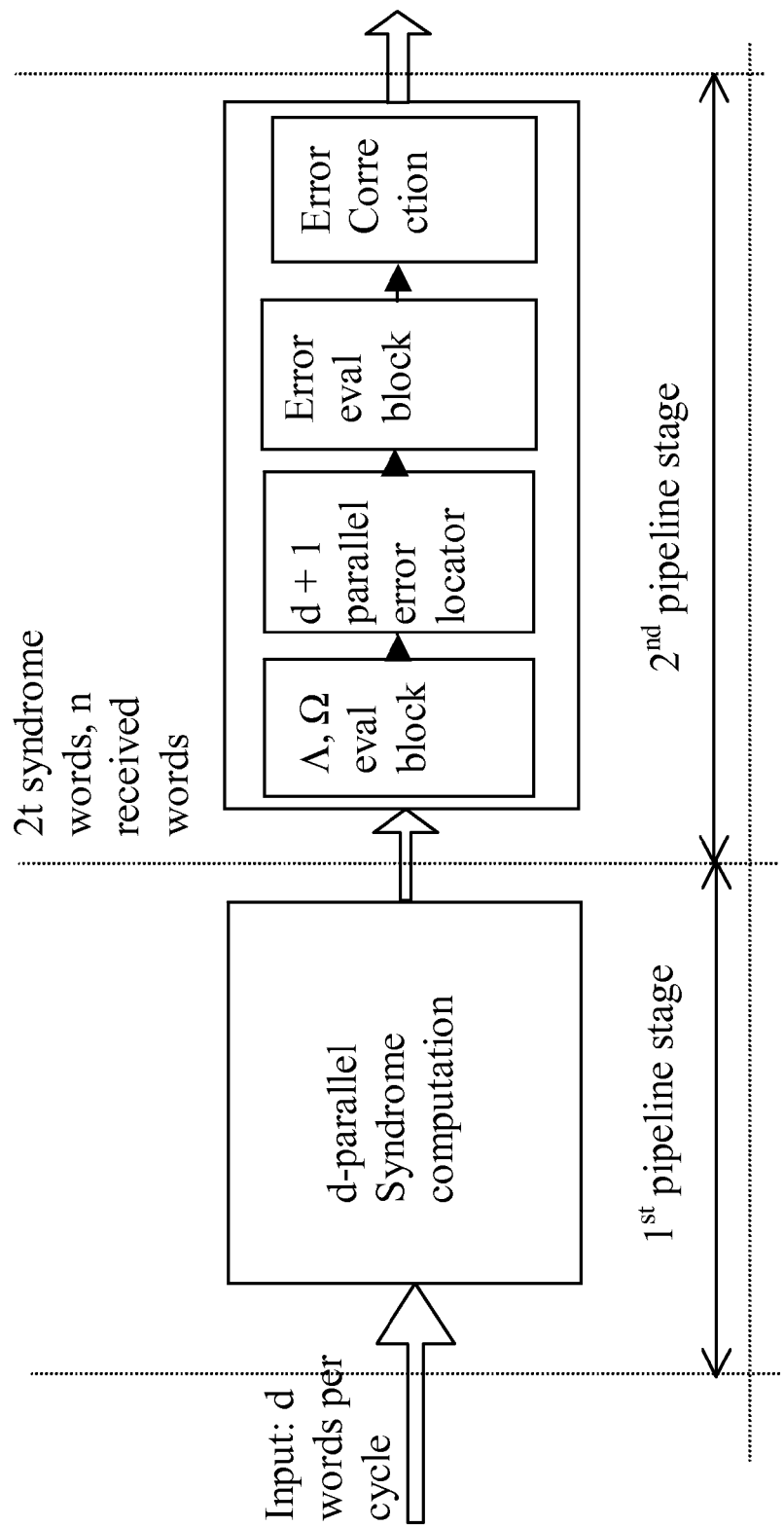
FIG. 1 is a functional block diagram showing an RS decoder architecture embodying the present invention.

FIG. 1 is a block diagram showing an RS decoder architecture embodying the present invention. The input arrives at the rate of d words per clock cycle. One block of code has a length of $2^m-1$ words. Therefore, one complete code block is received in $(2^m-1)/d$ clock cycles. As shown in FIG. 1, we use a two stage pipeline for our computation. The first pipeline stage performs syndrome computation. The second pipeline stage performs error locator polynomial computation, error location, error evaluation, and error correction.

The following observations are made about this design architecture:

Input data arrives at a rate of d words per clock cycle, or $(2^m-1)/d$ clock cycles per code block. Therefore, designing a circuit that is capable of a higher throughput is not useful, and probably consumes excess resources.

The two key compute intensive blocks of the decoder are the syndrome computation and error location. Both these items lie on the critical path and cannot share resources. Therefore, they occupy separate pipeline stages.

Computing the error locator polynomial, error evaluation, and error correction are relatively inexpensive in terms of clock cycles and resource utilization. Therefore, these can be combined with any of the compute intensive sections to create a pipeline.

Given the regular and simple nature of the computation, the syndrome computation block is best implemented as a separate pipeline stage. Therefore, all other tasks are clubbed into the second pipeline stage. Given the sequential nature of the tasks involved, substantial resource sharing can be achieved by the second pipeline stage. The details of resource sharing are described later on in this section.

After the errors are located, they need to be corrected. Therefore, a copy of the input needs to be stored in a buffer/FIFO queue until all errors have been located and evaluated. Since input data arrives continuously, the amount of storage extra required is proportional to the latency of the decoder. For example, if error location and evaluation happens 10,000 cycles after the first data word is clocked in, each data word must be stored for 10,000 clock cycles. Since input arrives continuously, at any time, 10,000 words of data should be stored. Therefore, reducing the latency leads to a reduction in size of the storage buffer.

Our two stage pipeline, with the first stage and second stage taking up roughly the same number of cycles (approximately $2^m/d$ to compute) reduces the total buffer size to $2(2^m/d)$ (d-words)=$2^{(m+1)}$ words.

Since we require both pipeline stages to take approximately the same time ($2^m/d$), we require to parallelize the two key tasks: syndrome computation and error location accordingly. Syndrome computation (as described later on this section) is parallelized d-ways, and completes in $2^m/d$ cycles. Error location is parallelized d+1 ways and completes in $2^m/(d+1)$ cycles. The extra parallelism of the error location cycle is to enable completion of the other tasks: error polynomial computation, error evaluation and error correction.

The above-mentioned observations are a significant aspect of the design of the decoder. Below, the detailed design of each individual block of the decoder is described in a separate section.

Syndrome Computation Block

The first step in RS decoding is syndrome computation, which involves the computation of 2t syndrome words from n received words, as outlined in the previous section. This is done according to the formula:

$$s_i = \sum_{j=1}^{n} r_j \alpha_i^j, i \in \{1, 2, 3, \ldots, 2t\} = \sum_{j=1}^{n} r_j X_j^i, \text{ where } X_j = \alpha^{-j} \quad (2)$$

Now, new data is available every $(2^m-1)/d$ cycles, the syndrome computation block must finish computing in $(2^m-1)/d$ cycles. In order to achieve this, the following transformation is applied to the syndrome computation equation:

$$s_i = \sum r_j \alpha_i^j =$$

$$\sum_{j=0}^{(2^m-1)/d} \left( r_{dj} \alpha_i^{dj} + r_{dj+1} \alpha_i^{dj+1} + \ldots + r_{dj+d=1} \alpha_i^{dj+d-1} \right)$$

$$\Rightarrow s_i = ((( \ldots (T_{(2^m-1)/d} \alpha_i^d + T_{(2^m-1)/d-1}) \alpha_i^d + T_{(2^m-1)/d-2})$$

$$\alpha_i^d + \cdot T_{(2^m-1)/d-3}) \alpha_i^d + \ldots + T_0),$$

$$T_k = (r_{dk} \alpha_i^0 + r_{dk+1} \alpha_i^1 + \ldots + r_{dk+d=1} \alpha_i^{d-1})$$

Equation A

Figure 2:
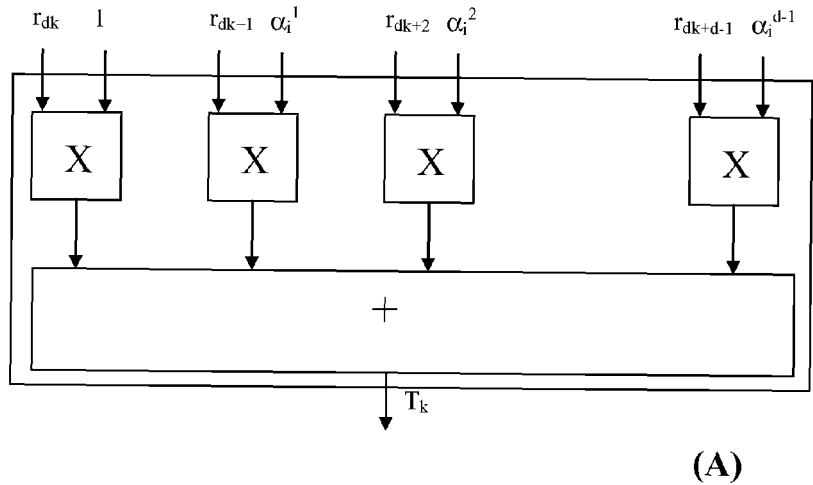
FIGS. 2(A) and 2(B), sometimes referred to herein collectively as FIG. 2, are functional block diagrams illustrating a circuit embodying the present invention.
Figure 2:
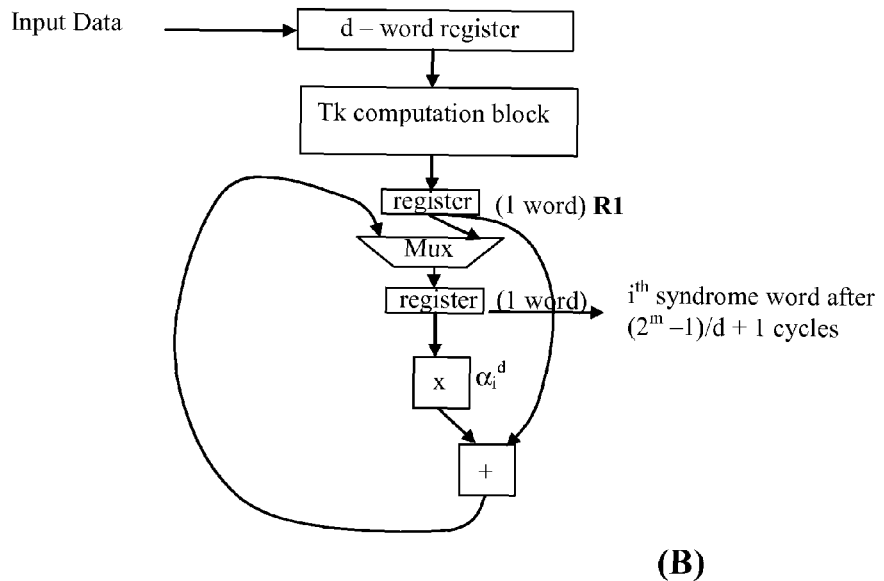

Equation A indicates that syndrome computation consists of two atomic steps:
Computing $T_k$
Computing $\alpha_i^d T_k + T_{k-1}$ FIGS. 2(A) and 2(B), sometimes referred to herein collectively as FIG. 2, are functional block diagrams illustrating a circuit embodying the present invention. As shown in FIG. 2A, the input is first clocked into a d-word register that feeds a Tk computation block (FIG. 2B). The output of the Tk computation block feeds a single word register (R1). The output of the single word register feeds the output register through a multiplexer (MUX). The other port of the MUX is fed by a Multiply-add functional unit fed by the register R1 and the output register. The sequence of computations that takes place, by clock cycle, is as follows (N=(2m−1)/d):

Data $r_n, r_{n-1}, \ldots, r_{n-d+1}$ →d-word register
$r_{n-d}, r_{n-d-1}, \ldots, r_{n-2d+1}$ →d-word register, $T_N$→R1
$r_{n-2d}, r_{n-2d-1}, \ldots, r_{n-3d+1}$ →d-word register, $T_{N-1}$→R1, R1→output register (output register contains TN)
$r_{n-3d}, r_{n-3d-1}, \ldots, r_{n-4d+1}$ →d-word register, $T_{N-2}$→R1, $T_N \alpha_i^d + T_{N-1}$ →output register
$r_{n-4d}, r_{n-4d-1}, \ldots, r_{n-5d+1}$ →d-word register, $T_{N-3}$→R1, $\alpha_i^d$ $(T_N \alpha_i^d + T_{N-1}) + T_{N-2}$ →output register
...

Therefore, the computation completes in N+4 cycles. The hardware requirements for this block are as follows:
m×m multipliers: d×2t
m bit adders: d×2t
registers: 2t×(d+2) words, m bits each
The critical path is given by $T_{mult} + \log_2(d \times T_{add})$ Λ, Ω Evaluation Block As mentioned above, this block uses the syndrome words to compute the error locator polynomial and the error evaluator polynomial. Several optimized algorithms for performing this task have been presented in the literature, and are surveyed [[0036]1]. Table 1 presents a summary of key results. Note, however, that our implementation does not have to use the resources shown in the table—we just need enough resources to ensure that all tasks assigned to the second pipeline stage complete fast enough to keep the pipeline flowing. However, these resources do serve as an upper bound on what is required.

TABLE 1

Implementing the Λ, Ω Evaluation Block

| Architecture | Add | Mult | Registers | Muxes | Cycles | Critical Path |
|---|---|---|---|---|---|---|
| IBM (Blahut) | 2t + 1 | 3t + 3 | 4t + 2 | t + 1 | 3t | >2 (Tmult + Tadd) |
| IBM (Berlekamp-Massey) | 3t + 1 | 5t + 3 | 5t + 3 | 2t + 1 | 2t | >2 (Tmult + Tadd) |
| riBM | 3t + 1 | 6t + 2 | 6t + 2 | 3t + 1 | 2t | Tmult + Tadd |
| Euclidian (folded) | 2t + 1 | 2t + 1 | 10t + 5 | 14t = 327 | 12t | Tmult + Tadd + Tmux |

Error Locator Block

The error locator blocks solves the $t^{th}$ degree polynomial, Λ(z)=0 by substituting for z, every number in GF($2^m$). Therefore, the solution process involves, for every element, $\alpha^j$, j∈{1, $2^m$}, evaluating Λ(z) according to the following formula:

$$\Lambda(z) = 1 + \sigma_1 z + \sigma_2 z^2 + \ldots + \sigma_t z^t \quad (3)$$

The coefficient, j, of a root $\alpha^j$ uniquely identifies an error location. A single evaluation of Λ(z) consumes t−1 multiplications and t−1 additions, and can be completed in a single clock cycle, whose period is greater than $T_{mult} + \log_2(T_{add}(t-1))$. Therefore, $2^m-1$ evaluations of Λ(z) take $2^m-1$ clock cycles if we assume that we have t−1 multipliers and t−1 adders. Note, however, that this causes the latency of the second pipeline stage, of which error location is part, to exceed $2^m-1$ clock cycles. Since the first pipeline stage only uses $(2^m-1)/d+4$ clock cycles, this delay is clearly unacceptable. In order to ensure that the pipeline stays balanced, we need to perform error location at a rate greater than $(2^m-1)/d$ for a complete code block, in order to ensure that all operations in the second pipeline stage (error location, $\Lambda$, $\Omega$ computation, Forney error evaluation, error correction) can complete in under $(2^m-1)/d+4$ clock cycles. Therefore, we simultaneously evaluate d+1 copies of $\Lambda(z)$, where d is the number of data words latched in per clock cycle.

We now present a means of performing K parallel evaluations of the $\Lambda(z)$:

We define K initial polynomials as follows:

$$P_i = \sum_{j=1}^{t} \sigma_j \alpha^{ij}, i \in \{1, 2, 3, \ldots, K\}$$

In the first clock cycle, $P_i$ evaluates $\Lambda(\alpha^i)$

In each subsequent cycle, the $j^{th}$ term of Pi is multiplied by $\alpha^{jK}$, i.e., $P_i(2) = \sigma_0 + \sigma_1 \alpha^{1+K} + \sigma_2 \alpha^{2+2K} + \ldots + \sigma_t \alpha^{t+tK}$,
$P_i(3) = \sigma_0 + \sigma_1 \alpha^{1+2K} + \sigma_2 \alpha^{2+4K} + \ldots + \sigma_t \alpha^{t+2tK}$,
. . .

The entire evaluation concludes in $(2^m-1)/d+1$ clock cycles (assuming one cycle to initialize the polynomial)

The hardware realization of this block is presented in "Architecture" section, below.

Error Evaluator Block

The roots, $\alpha^{-k}$, of the error locator polynomial, $\Lambda$, can be used to compute the error magnitudes according to the following formula: $e_k = \alpha^{-k} \Omega(\alpha^{-k})/\Lambda'(\alpha^{-k})$. Since the maximum number of located errors is t, the number of error evaluations is bounded by t. Each error evaluation consists of the following steps:

Determining the polynomial $\Lambda'(z)$ by differentiating $\Lambda(z)$: Differentiating a polynomial involves re-computing its coefficients according to the following rule: $f(z) = \alpha_0 + \alpha_1 z + \ldots + \alpha_{n-1} x^{n-1} \Rightarrow f'(z) = \alpha_1 + 2\alpha_2 z + \ldots + (n-1)\alpha_{n-1} z^{n-2} = \alpha_1 + \alpha_3 z^2 + \alpha_5 z^4 + \ldots + \alpha_{n-1} z^{n-2}$. In computing the derivative, we utilize a characteristic of Galois Field addition, i.e., $\alpha + \alpha = 0$. Therefore, computing the derivative merely involves the selection of the coefficients of odd powers of a polynomial.

Evaluating $\Lambda'(\alpha^{-k})$: Evaluating the polynomial involves multiplying each coefficient with the appropriate power of $\alpha^{-k}$ and accumulating the result to compute $\Lambda'(\alpha^{-k})$. We can save time by observing that the error locator block computes $\Lambda(\alpha^{-k}) = \sigma_0 + \sigma_1 \alpha^{-k} + \sigma_2 \alpha^{-2k} + \ldots + \sigma_t \alpha^{-tk}$. Therefore, the desired powers of $\alpha^{-k}$ are available when the error locator is in operation. If the error locator locates a zero, i.e., if, we then store the powers of $\alpha^{-k}$ in a separate FIFO. Since the error locator polynomial has a maximum of t roots, the total storage required for this operation is t×m. Note that the stored powers of $\alpha^{-k}$ can also be used to compute $\Omega(\alpha^{-k})$ Inverting $\Lambda'(\alpha^{-k})$ to get $\Lambda'(\alpha^{-k})^{-1}$: The inverse is computed by referring to a look up table of length $2^m-1$.

Evaluating $\Omega(\alpha^{-k})$: This t-1 degree polynomial is computed in the same step that computes $\Lambda$. Since the coefficients of the polynomial are available and the powers of $\alpha^{-k}$ are also available, this computation involves t-1 multiplications and t additions.

Multiplying $\Lambda'(\alpha^{-k})^{-1}$ with $\Omega(\alpha^{-k})$ and $\alpha^{-k}$ to obtain the result: This step can be straightforwardly performed in two clock cycles with a single multiplier.

Architecture, Implementation of the Second Pipeline Stage

This section outlines the architecture and implementation of the error locator polynomial computation, error location, error evaluation, and error correction tasks performed by the RS decoder. Collectively, these tasks form the second stage of the two stage decode pipeline. The plurality of tasks involved argues for a processor style architecture with register files, functional units, and a programmable controller. In what follows, we first describe our architecture, and then describe how this architecture can be used to realize the second pipeline stage. This description takes the form of a register transfer level language.

Architectural Description

Figure 3:
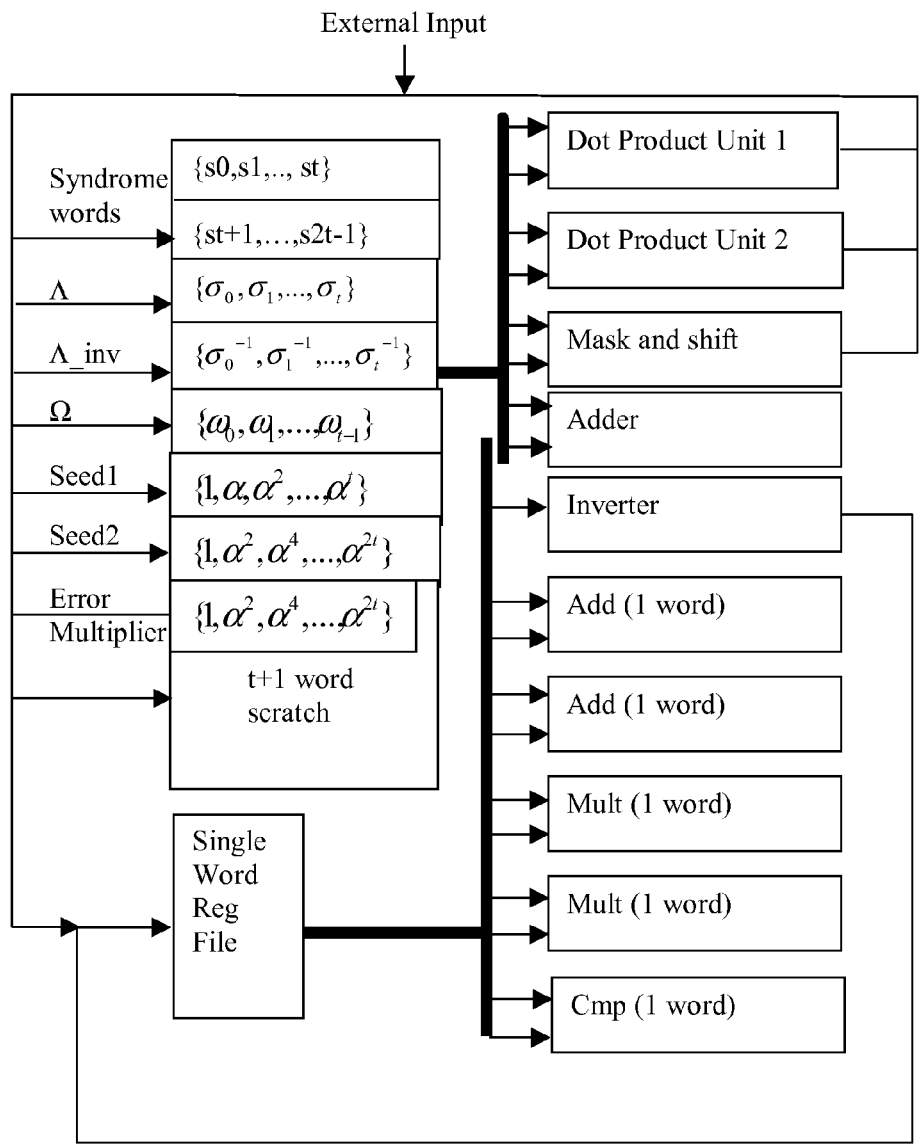
FIG. 3 is a functional block diagram showing the architecture of the second stage of the RS decode pipeline.

FIG. 3 is a functional block diagram showing the architecture of the second stage of the RS decode pipeline. We now describe salient elements of our architecture:

t+1-word register file: Most polynomials required for decoding the RS code have t+1 or fewer coefficients. Therefore, a t+1 word register file is a logical choice for storing polynomials and intermediate results. In addition, operations in the Galois field often involve shifts, a special operation call Chain shift is defined as follows: Chain Shift (R1, R2, R3) shifts the contents of R1 into R2, and the contents of R2 into R3, one word at a time. If R1={r1_0, . . . , r1_t}, R2= {r2_0, . . . , r2_t}, and R3={r3_0, . . . , r3_t} before the chain shift operation, the contents of the three registers after the chain shift operation are as follows: R1={0, r1_0, . . . , r1_t-1}, R2={r1_t,r2_0, . . . , r2_t-1}, R3={r2_t,r3_0, . . . , r3_t-1}. If Chain Shift is invoked with two operands, R2 and R3, R1 is assumed to be zero.

1 word register file: A small set of 1-word registers is available for storing single word results.

Stack: A t element stack, with each element consisting of t+1 words is part of the register file.

Dot Product Computing Unit: The error locator and the error evaluator perform, respectively, $2^m$ and $2 \times t$ instances of polynomial evaluation. In each case, the operation involves:

Multiplying $\alpha^{-jk}$ with the desired coefficient

Accumulating the result

Since $\alpha^{-jk}$ is always at the beginning of the computation, the polynomial evaluation performed by the RS decoder is simplified into a dot product computation:

$$\sum_{i=1}^{n} a_i b_i$$

Given $\{a_1, a_2, a_3, \ldots, a_n\}\{b_1, b_2, \ldots, b_n\}$, two vectors, computer. Since the polynomials generated in the RS decoding process have a maximum degree of t, we derive dot-product computing units can handle a total of 2(t+1) inputs. In addition, under some circumstances, we require the dot product computing unit to generate the t+1-word intermediate result: $\{a_i b_i, i \in \{1, t+1\}\}$ Therefore, the dot product outputs a t+q-word intermediate result and a 1 word final result. As mentioned in Section 3.3, d+1 copies of the error locator algorithm are implemented in parallel. Therefore, we require (d+1) dot product computing units. For the following analysis, we assume that d=1; therefore, we have two dot product units. Therefore, these two dot product units can perform the two polynomial evaluations required for error evaluation in parallel. In addition, these dot product units can also be used to evaluate the error locator polynomial, as discussed later on in this section.

Inversion Unit: As mentioned earlier, the error evaluator requires several instances of inverse computation. Therefore an inversion functional unit, realized using a look up table, is available. The inversion unit is capable of computing one inverse per clock cycle.

Multipliers, Adders, comparator: A total of two multipliers and two adders that operate on single word operands are available to handle miscellaneous tasks. A single word comparator is also available.

Mask and Shift Unit: The mask can shift the contents of a t+1-word register to the right or left at a one-word granularity. Therefore, a register entry {a1, a2, at+1} can be transformed into {a2, a3, . . . , at+1, a1} or {at+1, a2, a3, . . . , at}. In addition, the option to mask individual words of the t+1 word register is also available. The manner in which the masking is performed is decided by the output of a mask register. For example, a mask register set to {1,1,1, . . . , 1,0} and a left shift would yield the result {a2, a3, . . . , at, 0}.

Interconnect: The t+1 word register file has six input ports and six output ports. The two outputs of the dot product unit can be routed to different registers. Single word quantities are expanded out to t+1 in the following manner before being written into the t+1 word register file: {x}→{x, x, . . . t+1 times, x}. The 1 word register file is capable of accepting inputs from the single word functional units, as well as single word outputs of t+1 word functional units, e.g., the dot product computation unit RTL Implementation using our Architecture We now present the pseudo code for implementing the second stage of the RS decode pipeline using the architecture presented in the previous section. The pseudocode is annotated with comments that describe the numbers of clock cycles consumed by individual tasks, as well as variable names and functions. In all, the program takes $2^{m-1}+12t+9$ cycles to complete execution, assuming that error location is parallelized by a factor of 2. Recall that, if the syndrome computation is not parallelized, i.e., if d=1, the first pipeline stage executes in $2^m+3$ clock cycles (latency), and has a throughput of $2^m-1$. For the case of m=8, t=8, the first stage executes in 259 cycles and has a throughput of 255 cycles, and the second stage takes 233 clock cycles. Since both pipeline stages have a throughput that is faster than the data rate: 1 word per clock cycle or 255 cycles per frame, this implementation is capable of decoding RS codes in real time.

A two stage pipelined architecture was disclosed to perform RS decoding in a resource efficient manner. The pipeline features parallelized implementations of the decoders key tasks to match the input rate. Combining several of the decoding tasks into a single pipeline stage, we enable resource sharing between sequential tasks, thereby resulting in a resource efficient implementation. In addition, the small number of pipeline stages and the balance between the two stages results in a low latency implementation, thereby resulting in a very small buffer to store the input data, further reducing the implementation cost.

A preferred pseudocode implementation is presented in the annexed APPENDIX.

Although preferred embodiments of the invention have been disclosed for illustrative purposes, those skilled in the art will appreciate that many additions, modifications, and substitutions are possible without departing from the scope and spirit of the invention.

REFERENCES

1. High speed architectures for Reed-Solomon decoders, D. V. Sarwate and N. R. Shanbag, IEEE Trans. VLSI Systems, Vol. 9, No. 5, Oct 2001

APPENDIX

Pseudocode Implementation
// The first step is to compute the error location polynomial, and it takes 3*2t+2 cycles
1) Lambda_Reg={1,0,0, . . . , 0};B_reg={0,0,0, . . . , 1}, S_lo={S_t,S_t−1, . . . ,S_0};S_hi={0,0,S_2t−1, . . . , S_t+1}; R=0;Count=2t−1;Gamma=1;k=0;−k=0 //$\lambda$=1, B=1, $\lambda$=1, Lambda_reg, B_reg, Gamma, contain $\lambda$, $\gamma$, and B respectively.
2) S_temp=Chain_Shift(S_hi_copy,S_lo_copy,S_temp)// S_temp={s0,0, . . . 0}
3) Delta=DP(S_temp,Lambda_Reg);Bz=Left_Shift(Breg);// $\delta = s_r \lambda_0 + s_{r-1}\lambda_1 + \ldots + s_{r-t}\lambda_t$
4) R=R+1; Temp1=DP(Gamma,Lambda);Temp2=DP(Delta, Bz);Test=(Delta !=0) & k>=0; S_temp=Chain_shift(S_hi, S_lo,S_tmp);If (R=count) break;//temp1=$\gamma\lambda$,temp2=$\delta$Bz, r=r+1
5) Branch on Test 7
6) Lambda=Temp1+Temp2;Breg=Lambda;Gamma=Delta; k=−k−1;−k=1+k; Go to 3
7) k=k+1;−k=−k−1;Go to 3
8) //Computing Omega according to the Equation: $\omega_i = s_i\lambda_0 + s_{i-1}\lambda_1 + \ldots + s_0\lambda_i$, i∈{0,1, . . . , t−1}$\Omega = \omega_0 + \omega_1 z + \ldots + \omega_{t-1}z^{t-1}$, takes 2(t+1)+2=2t+4 cycles
9) r=0;count=t;ChainShift(S_hi,S_lo,S_tmp)
10) Omega1=DP(S_tmp,Lambda_Reg); ChainShift(S_hi,S_lo,S_tmp)
11) ChainShift(Omega1,Omega);Omega1=DP(S_tmp, Lambda_Reg);r=r+1
12) ChainShift(S_hi,S_lo,S_tmp);Test3=cmp(r,t);if (Test3==1) Go to 11;
13) //Evaluate two copies of the error locator polynomial: $\Lambda(\alpha^i)$, i∈{1.2 . . . ,255}, compare each to zero, and store $\alpha^i$ etc., corresponding to the roots in the stack, takes $2^m/2+1$ cycles
14) Seed1={1,$\alpha,\alpha^2,\alpha^3$, . . . , $\alpha^t$};Seed2={1,$\alpha,\alpha^2,\alpha^4,\alpha^6$, . . . , $\alpha^{2t}$}; Mult={1,$\alpha,\alpha^2,\alpha^4,\alpha^6$, . . . ,$\alpha^{25}$};
15) (Temp1,Result1)=DP(Seed1,Lambda_Reg);(Temp2,Result2)=DP(Seed2,Lambda_Reg)// Temp1={$\sigma_0,\sigma_1,\alpha$, . . . , $\sigma_t\alpha^t$},Temp2={$\sigma_0,\sigma_1\alpha^2$, . . . , $\sigma_t\alpha^{2t}$}, result1=$\sigma_0+\sigma_1 z+ \ldots + \sigma_t\alpha^t$,
16) (Temp1,Result1)=DP(Temp1,Mult);(Temp2,Result2)= DP(Temp2,Mult);If (Result1==0), {NumErrors1++; Temp1→Stack;} If (Result2==0) {Temp2→Stack;NumErrors2++};Go to 16
17) If (Result1==0){NumErrors1++;Temp1→Stack;} If (Result2=+0) {Temp2→Stack;NumErrors2++}
18) //Now, we compute the error magnitude for all of the locations identified and correct the error, consumes a total of 4t+2 cycles
19) LambdaInv=Inverse(Lambda_Reg);//The inverse of every element of LambdaReg is computed and the result is stored in a t+1 register LambdaInv, LambdaInv={$\sigma_0^{-1}, \sigma_1^{-1}, \ldots, \sigma_t^{-1}$}, takes t+1 cycles because we have only 1 inverter
20) count=0;NumErrors=NumErrors1+NumErrors2;Pop Stack→{R11,ErrorLoc,ErrorCoeff};
21) (R12,Temp)←DP(R11,LambdaInv);Message[ErrorLoc]+=R14;If(count==NumErrors) go to 25;

22) R14←DP(R12,Omega);R13←DP(dLambda,R12);
23) R13=Inv(R13);R14=Mult(R14,ErrorCoeff); Pop Stack→{R11,ErrorLoc,ErrorCoeff};Go to 22
24) End

What is claimed:

1. A method for using a decoder to decode a received data signal which has previously been encoded with a predetermined coding scheme, the method comprising the steps of:
dividing tasks that need to be performed for decoding into a two stage pipeline; and balancing execution times of individual pipeline stages, so as to optimize resource sharing within the pipeline stages,
wherein syndrome computation and error location are performed at least partially in parallel within the pipeline stages.

2. The method of claim 1 wherein the coding scheme is a Reed Solomon code.

3. The method of claim 2 wherein the tasks to be performed include syndrome computation, error locator polynomial evaluation, error location, and error evaluation.

4. The method of claim 3 wherein the first pipeline stage performs syndrome computation and the second pipeline stage performs at least error location.

5. The method of claim 4 wherein the second pipeline stage additionally performs at least one of error locator polynomial computation, error evaluation, and error correction.

6. The method of claim 3 wherein the first pipeline stage performs syndrome computation and the second pipeline stage performs at least one of error locator polynomial computation, error location, error evaluation, and error correction.

7. The method of claim 6 wherein the second pipeline stage performs error locator polynomial computation, error location, error evaluation, and error correction.

8. The method of claim 3, wherein an ith syndrome word in the data signal, $s_i$, determined as follows:
$s_i = (( \ldots (T_{(2^m-1)/d}\alpha_i^d + T_{(2^m-1)/d-1})\alpha_i^d + T_{(2^m-1)/d-2})\alpha_i^d + T_{(2^m-1)/d-3})\alpha_i^d + \ldots + T_0)$, where
$T_k = (r_{dk}\alpha_i^0 + r_{dk+1}\alpha_i^1 + \ldots + r_{dk+d=1}\alpha_i^{d-1})$ and
d is the number of received code words $r_{di}$, per clock cycle
m is the length of a received word
$\alpha_i^j$ is a root of the error evaluator polynomial.

9. Apparatus for decoding a received data signal which has previously been encoded with a predetermined coding scheme, comprising:
a two stage pipeline wherein the stages share tasks that need to be performed for decoding; and
means for balancing execution times of individual pipeline stages, so as to optimize resource sharing within the pipeline stages, wherein the apparatus is constructed to perform syndrome computation and error location at least partially in parallel.

10. The apparatus of claim 9 constructed to decode a data signal that has been encoded with a Reed Solomon code.

11. The apparatus of claim 10 constructed to perform tasks including syndrome computation, error locator polynomial evaluation, error location, and error evaluation.

12. The apparatus of claim 11 wherein the first pipeline stage is constructed to perform syndrome computation and the second pipeline stage is constructed to perform at least error location.

13. The apparatus of claim 12 wherein the second pipeline stage is constructed to additionally perform at least one of error locator polynomial computation, error evaluation, and error correction.

14. The apparatus of claim 11 wherein the first pipeline stage is constructed to perform syndrome computation and the second pipeline stage is constructed to perform at least one of error locator polynomial computation, error location, error evaluation, and error correction.

15. The apparatus of claim 14 wherein the second pipeline stage is constructed to perform error locator polynomial computation, error location, error evaluation, and error correction.

16. The apparatus of claim 11 constructed to determine an ith syndrome word in the data signal, $s_i$, in accordance with the following equation:
$s_i = (( \ldots (T_{(2^m-1)/d}\alpha_i^d + T_{(2^m-1)/d-1})\alpha_i^d + T_{(2^m-1)/d-2})\alpha_i^d + T_{(2^m-1)/d-3})\alpha_i^d + \ldots + T_0)$, where
$T_k = (r_{dk}\alpha_i^0 + r_{dk+1}\alpha_i^1 + \ldots + r_{dk+d=1}\alpha_i^{d-1})$ and
d is the number of received code words $r_{di}$, per clock cycle
m is the length of a received word
$\alpha_i^j$ is a root of the error evaluator polynomial.

* * * * *